United States Patent
Guo et al.

(10) Patent No.: US 9,595,547 B2
(45) Date of Patent: Mar. 14, 2017

(54) ARRAY SUBSTRATE AND METHOD FOR REPAIRING BROKEN DATA LINE

(71) Applicants: BOE TECHNOLOGY GROUP CO., LTD., Beijing (CN); BEIJING BOE DISPLAY TECHNOLOGY CO., LTD., Beijing (CN)

(72) Inventors: Huibin Guo, Beijing (CN); Shoukun Wang, Beijing (CN); Liangliang Li, Beijing (CN); Yuchun Feng, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 43 days.

(21) Appl. No.: 14/568,813

(22) Filed: Dec. 12, 2014

(65) Prior Publication Data
US 2015/0340388 A1    Nov. 26, 2015

(30) Foreign Application Priority Data
May 21, 2014  (CN) .......................... 2014 1 0217057

(51) Int. Cl.
*H01L 27/12*  (2006.01)
*H01L 29/786*  (2006.01)

(52) U.S. Cl.
CPC ........ *H01L 27/1259* (2013.01); *H01L 27/124* (2013.01); *H01L 27/1222* (2013.01); *H01L 29/78663* (2013.01)

(58) Field of Classification Search
None
See application file for complete search history.

(56) References Cited

U.S. PATENT DOCUMENTS

| 6,358,759 B1 * | 3/2002 | Hirabayashi ...... G02F 1/136209 257/E27.132 |
| 6,388,334 B1 * | 5/2002 | Birdsley ............... H01L 21/485 257/374 |

(Continued)

FOREIGN PATENT DOCUMENTS

| CN | 202373580 U | 8/2012 |
| CN | 102938382 A | 2/2013 |

(Continued)

OTHER PUBLICATIONS

First Office Action and English Translation for CN2014102170577.

*Primary Examiner* — Julio J Maldonado
*Assistant Examiner* — Stanetta Isaac
(74) *Attorney, Agent, or Firm* — Nath, Goldberg & Meyer; Joshua B. Goldberg; Stanley N. Protigal

(57) ABSTRACT

The invention discloses an array substrate, and a method for repairing a broken data line on an array substrate. The method for repairing a broken data line on an array substrate includes steps: performing a treatment on a part of a semiconductor layer corresponding to an opening in a data line so that the part of the semiconductor layer becomes a conductive region, and the ends of the opening in the data line are electrically connected to each other by the conductive semiconductor layer. The above method for repairing a broken data line provided by the invention is not affected by the linewidth of the data line so that the broken data line can be repaired in the case that the linewidth of the data line is relatively small.

15 Claims, 2 Drawing Sheets

(56) References Cited

U.S. PATENT DOCUMENTS

| | | | |
|---|---|---|---|
| 2005/0272178 A1* | 12/2005 | Kim | G02F 1/136259 |
| | | | 438/30 |
| 2006/0270143 A1* | 11/2006 | Goldbach et al. | 438/238 |
| 2007/0131937 A1* | 6/2007 | Oh | 257/72 |
| 2010/0253870 A1* | 10/2010 | Liao et al. | 349/55 |
| 2011/0115765 A1* | 5/2011 | Chang | 345/206 |
| 2014/0117362 A1* | 5/2014 | Xi | H01L 27/1225 |
| | | | 257/59 |

FOREIGN PATENT DOCUMENTS

| | | |
|---|---|---|
| CN | 103207482 A | 7/2013 |
| CN | 103698922 A | 4/2014 |

\* cited by examiner

ARRAY SUBSTRATE AND METHOD FOR REPAIRING BROKEN DATA LINE

CROSS-REFERENCE TO RELATED APPLICATION

This application claims priority to and the benefit of Chinese Invention Application No. 201410217057.7 filed on May 21, 2014 and titled "Array Substrate and Method for Repairing Broken Data line", which is incorporated herein by reference in its entirety.

TECHNICAL FIELD

The present invention relates to the field of display technology, and particularly to an array substrate, and a method for repairing a broken data line on the array substrate.

BACKGROUND ART

Currently, with the rapid development of the display technology, the resolution of the display device is continuously increased. In order to obtain a better display effect of the display device, the array substrate of the display device needs a higher aperture ratio. In the prior art, the aperture ratio of the array substrate is generally increased by reducing the linewidth of the data line, for example, reducing the linewidth of the data line from more than 4.5 μm to 2-3 μm.

In the prior art, the data line of the array substrate is generally formed by a wet etching process. As for the wet etching process, the etch uniformity is proportional to the linewidth of the data line, that is, the narrower the data line is, the worse the etch uniformity is. Specially, when the linewidth of the data line is reduced to 2-3 μm, the worse etch uniformity will result in an opening occurring in the data line, that is, result in a broken data line.

Moreover, as the data line becomes narrower, it is more difficult to repair the broken data line. Thus, after the linewidth of the data line is reduced, the yield of the array substrate is lowed.

SUMMARY

The present invention is intended to solve at least one of the technical problems existing in the prior art. To this end, the present invention provides an array substrate and a method for repairing a broken data line. In the array substrate of the present invention, a semiconductor layer is provided below a data line. When there is an opening in the data line on the array substrate, the part of the semiconductor layer corresponding to the opening in the data line can be processed so as to make this part become a conductive region, which may then be used to electrically connect the separated ends of the broken data line, thus increasing the yield of the array substrate.

Particularly, the present invention provides an array substrate, including a plurality of data lines and a plurality of thin film transistors, wherein a semiconductor layer is provided below each data line.

Wherein, the width of the semiconductor layer is larger than the linewidth of the data line.

Wherein, the width of the semiconductor layer below the data line is in the range of 2 μm to 5 μm.

Wherein, the semiconductor layer and an active layer of the thin film transistor are provided in the same layer, and are made of the same material.

Wherein, the semiconductor layer is made of a-Si.

The present invention further provides a method for repairing a broken data line, for repairing an opening in a data line on an array substrate, wherein the array substrate includes a plurality of data lines and a plurality of thin film transistors, and a semiconductor layer is provided below each data line, the method for repairing a broken data line including:

performing a treatment on a part of the semiconductor layer corresponding to the opening in the data line so that the part of the semiconductor layer becomes a conductive region, and the ends of the opening in the data line are electrically connected to each other by the conductive semiconductor layer.

Wherein, the part of the semiconductor layer subjected to the treatment has a larger range than the opening in the data line.

Wherein, the treatment includes doping with ions of predetermined element by an ion implantation technology.

Wherein, the predetermined element includes one or more of P, B and N.

Wherein, the method for repairing a broken data line may further include performing the treatment on a part of the semiconductor layer that coincides with the ends of the opening in the data line.

Wherein, the semiconductor layer is made of a-Si.

Wherein, the linewidth of the data line is in the range of 2 μm to 5 μm.

Wherein, the method for repairing a broken data line may further include detecting a data line on the array substrate which has an opening, and determining the position of the opening in the data line, before repairing the opening in the data line.

Wherein, the width of the conductive region is larger than the linewidth of the data line.

The present invention can achieve the following advantageous technical effects:

In the array substrate of the present invention, the semiconductor layer is provided below the data line. Thus, when there is an opening in the data line, the part of the semiconductor layer corresponding to the opening in the data line can be processed to become a conductive region, so that the ends of the opening in the data line can be electrically connected by the conductive semiconductor layer; thus increasing the yield of the array substrate. Moreover, this method is not limited by the width of the data line, and thus the broken data line can be repaired when the linewidth of the data line is relatively small.

BRIEF DESCRIPTION OF THE DRAWINGS

Accompanying drawings are provided to make persons skilled in the art further understand of the present invention, constitute a part of the specification, are used to interpret the present invention in conjunction with the following embodiments, and will not limit the present invention to their precise forms. In the drawings.

REFERENCE SIGNS

1: array substrate; 10: glass base; 11: data line; 110: opening; 12: semiconductor layer.

DETAILED DESCRIPTION OF THE EMBODIMENTS

Embodiments of the present invention will be described in detail below in conjunction with the drawings. It should be understood that, the embodiments described herein are only used to describe and interpret the present invention and are not used to limit the present invention.

Figure 1:
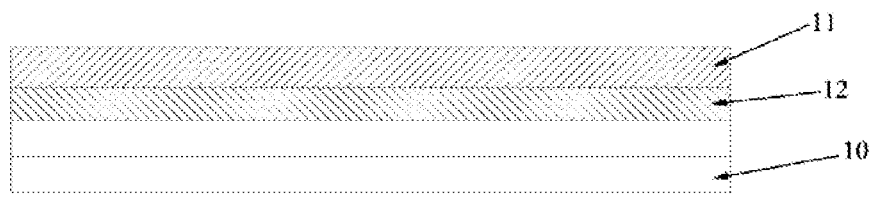
FIG. 1 is a schematic view of an array substrate according to an embodiment of the present invention.

FIG. 1 is a schematic view of an array substrate according to an embodiment of the present invention. As shown in FIG. 1, the array substrate 1 includes a glass base 10, and a plurality of data lines 11 and a plurality of thin film transistors (not shown in FIG. 1) prepared on the glass base 10. A semiconductor layer 12 is provided below the data line 11. Particularly, the semiconductor layer 12 and the active layer of the thin film transistor may be formed in the same layer, and are made of the same material. Thus, during the course of preparing the thin film transistor and the data line on the glass base 10, the active layer and the semiconductor layer 12 may be simultaneously formed on the glass base 10 by a single masking process, to save time and material required in the above course. Particularly, in the present embodiment, a material of the semiconductor layer 12 is a-Si. In the present embodiment, the linewidth of the data line 11 may be in the range of 2 µm to 5 µm. Preferably, the width of the semiconductor layer 12 is larger than the linewidth of the data line. Preferably, the width of the semiconductor layer is in the range of 2 µm to 5 µm.

Figure 3:
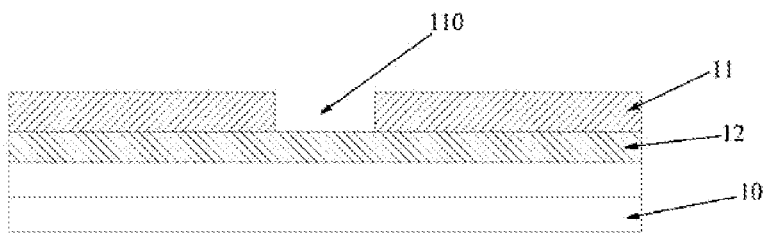
FIG. 3 is a diagram illustrating an array substrate on which there is an opening in the data line.

Actually, under the current level of the manufacturing process, when the data line 11 is formed by a wet etching process so that the linewidth of the data line 11 is in the range of 2 µm to 5 µm, a plurality of openings will be generated in the data line 11, as shown in FIG. 3.

Figure 2:
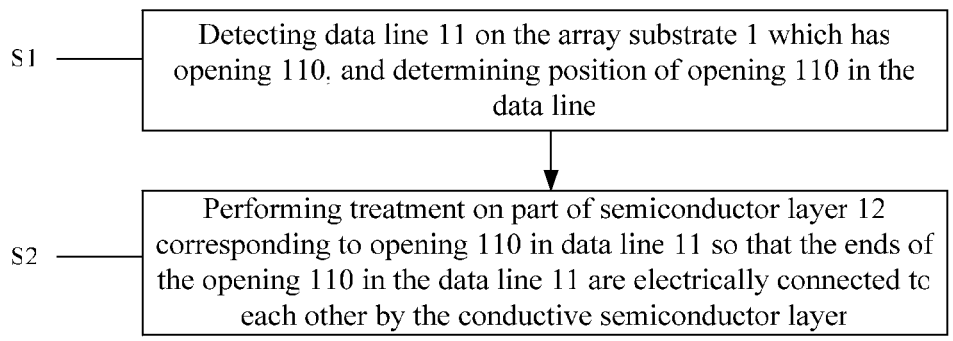
FIG. 2 is a flowchart of a method for repairing a broken data line according to an embodiment of the present invention.

Thus, the present invention further provides a method for repairing a broken data line, for repairing an opening in a data line on an array substrate. FIG. 2 is a flowchart of a method for repairing a broken data line according to an embodiment of the present invention. FIG. 3 is a diagram illustrating an array substrate on which there is an opening 110 in the data line 11. As shown in FIG. 3, in the present embodiment, a semiconductor layer 12 is provided below the data line 11. Preferably, the semiconductor layer 12 is made of a-Si.

In particular, as shown in FIG. 2, the method for repairing a broken data line includes following steps:

Step S1. detecting a data line 11 on the array substrate 1 which has an opening 110, and determining the position of the opening 110 in the data line; and Step S2. performing a treatment on a part of the semiconductor layer 12 corresponding to the opening 110 in the data line 11 so that the part of the semiconductor layer becomes a conductive region, and the ends of the opening 110 in the data line 11 are electrically connected to each other by the conductive region in the semiconductor layer.

Figure 4:
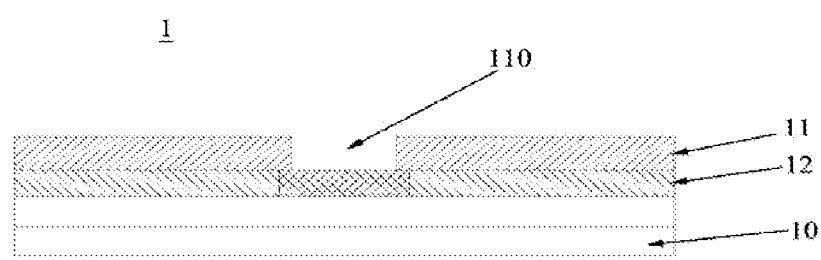
FIG. 4 is a schematic view of a structure with the part of the semiconductor corresponding to the opening in the data line doped with ions.

Preferably, the part of the semiconductor layer 12 subjected to the treatment has a larger range than the opening 110 in the data line 11, so as to achieve a better conductive effect, as shown in FIG. 4.

Figure 5:
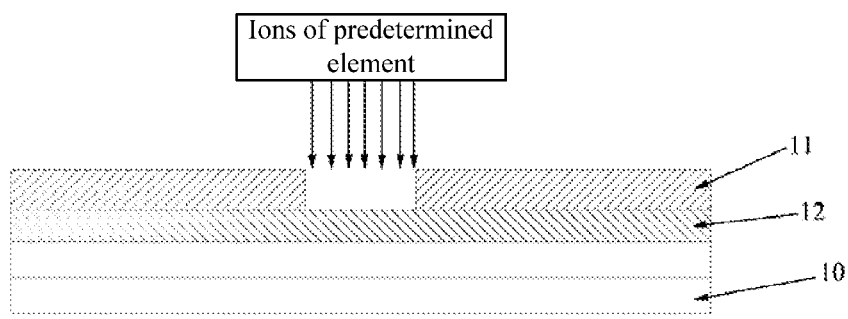
FIG. 5 is a diagram illustrating how to implant ions of predetermined element into the semiconductor layer by an ion implantation method.

Particularly, as shown in FIG. 5, in the step S2, a target region of the semiconductor layer 12 below the opening 110 is doped with ions of predetermined element by an ion implantation method, so that the target region becomes a conductive region. When performing an ion implantation process on the semiconductor layer 12, the target region needs to fully cover the opening in the data line so that the ends of the opening in the data line may be electrically connected to each other. Preferably, the range of the target region may be larger than that of the opening in the data line, so that a part of the semiconductor layer which coincides with the ends of the opening in the data line also becomes a conductive region by the ion implantation method, to achieve a better conductive effect, as shown in FIG. 4.

Preferably, in the present embodiment, the predetermined element includes one or more of P, B and B.

In the present embodiment, along the direction of the data line 11 at the opening 110, the ions of predetermined element are implanted into the region of the semiconductor layer 12 below the opening 110, so as to make the ends of the opening 110 in the data line 11 electrically connected to each other. This method for repairing a broken data line is not limited by the linewidth of the data line 11, so even in the case that the linewidth of the data line 11 is relatively small, the method for repairing a broken data line provided by the present invention can repair the broken data line 11. Preferably, in the present embodiment, the linewidth of the data line 11 is in the range of 2 µm to 5 µm. Preferably, the width of the semiconductor layer 12 is in the range of 2 µm to 5 µm.

Preferably, in the array substrate according to the embodiment of the present invention, the width of the semiconductor layer 12 may be larger than that of the data line 11, so that a better conductive effect can be achieved after ions are implanted into the semiconductor layer 12.

Preferably, the width of the conductive region shown in FIG. 4 is larger than the width of the opening 110 in the data line 11, so that the ends of the opening in the data line may be better electrically connected to the conductive region, to further improve the conductive effect.

In summary, in the method for repairing a broken data line according to the embodiment of the present invention, the part of the semiconductor layer 12 corresponding to the opening 110 in the data line 11 is processed to become a conductive region, via which the ends of the opening in the data line are electrically connected to each other, thus increasing the yield of the array substrate 1; moreover, the method for repairing a broken data line of the present invention is not limited by the linewidth of the data line 11, so even in the case that the linewidth of the data line 11 is relatively small, the method for repairing a broken data line provided by the present invention can repair the broken data line 11.

It should be pointed out that, in the present embodiment, the predetermined element includes one or more of P, B and N, and however, the present invention is not limited thereto. In an actual application, the predetermined element may be other element other than P, B and N, so long as a corresponding region of the semiconductor layer 12 becomes a conductive region after ions of predetermined element are implanted thereinto.

It should also be pointed out that, in the present embodiment, the semiconductor layer 12 is made of a-Si, and however, the present invention is not limited thereto. In an actual application, the semiconductor layer 12 may be made of other semiconductor material such as p-Si.

It should be understood that the embodiments above are just exemplary embodiments of the present invention to describe the principle of the present invention, and the present invention is not limited thereto. Any person skilled in the art can make various changes and substitutions without departing from the spirit and substance of the present invention, which should be considered to be within the protection scope of the present invention.

The invention claimed is:

1. An array substrate, including a plurality of data lines and a plurality of thin film transistors, wherein
   an un-doped semiconductor layer is provided below each data line; and
   a part of the semiconductor layer corresponding to an opening in a data line is treated so that the part of the semiconductor layer becomes a conductive region, and the ends of the opening in the data line are electrically connected to each other by the conductive semiconductor layer.

2. The array substrate of claim 1 wherein the width of the semiconductor layer is larger than the linewidth of the data line.

3. The array substrate of claim 1 wherein the width of the semiconductor layer below the data line is in the range of 2 µm to 5 µm.

4. The array substrate of claim 1, wherein the semiconductor layer and an active layer of the thin film transistor are provided in the same layer, and are made of the same material.

5. The array substrate of claim 1, wherein the semiconductor layer is made of a-Si.

6. The array substrate of claim 4, wherein the semiconductor layer is made of a-Si.

7. A method for repairing a broken data line, for repairing an opening in a data line on an array substrate, wherein the array substrate includes a plurality of data lines and a plurality of thin film transistors, and an un-doped semiconductor layer is provided below each data line, the method for repairing a broken data line including:
   performing a treatment on a part of the semiconductor layer corresponding to the opening in the data line so that the part of the semiconductor layer becomes a conductive region, and the ends of the opening in the data line are electrically connected to each other by the conductive semiconductor layer.

8. The method for repairing a broken data line of claim 7, wherein the part of the semiconductor layer subjected to the treatment has a larger range than the opening in the data line.

9. The method for repairing a broken data line of claim 7, wherein the treatment includes doping with ions of predetermined element by an ion implantation technology.

10. The method for repairing a broken data line of claim 9, wherein the predetermined element includes one or more of P, B and N.

11. The method for repairing a broken data line of claim 7, further including:
    performing the treatment on a part of the semiconductor layer that coincides with the ends of the opening in the data line.

12. The method for repairing a broken data line of claim 7, wherein the semiconductor layer is made of a-Si.

13. The method for repairing a broken data line of claim 7, wherein the linewidth of the data line is in the range of 2 µm to 5 µm.

14. The method for repairing a broken data line of claim 7, further including detecting a data line on the array substrate which has an opening, and determining the position of the opening in the data line, before repairing the opening in the data line.

15. The method for repairing a broken data line of claim 7, wherein the width of the conductive region is larger than the linewidth of the data line.

* * * * *